United States Patent
Della Fiora et al.

(10) Patent No.: US 7,656,651 B2
(45) Date of Patent: Feb. 2, 2010

(54) APPARATUS AND METHODS FOR AUTOMATICALLY POSITIONING AN INTERFACE MODULE IN A RACK SYSTEM

(75) Inventors: Troy A. Della Fiora, Spring, TX (US); Joseph R. Allen, Tomball, TX (US); Eric Mei, Houston, TX (US); Everett R. Salinas, Pasadena, TX (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 110 days.

(21) Appl. No.: 12/121,933

(22) Filed: May 16, 2008

(65) Prior Publication Data

US 2008/0304224 A1   Dec. 11, 2008

Related U.S. Application Data

(60) Provisional application No. 60/943,201, filed on Jun. 11, 2007.

(51) Int. Cl.
    *H05K 5/00* (2006.01)
(52) U.S. Cl. .............................. 361/679.21; 248/286.1; 248/917; 361/724
(58) Field of Classification Search ................. 361/724, 361/727, 729, 683, 679.05, 679.06, 679.07, 361/679.21, 679.02, 679.04; 248/917–919, 248/292.12, 292.13, 292.14, 286.1
See application file for complete search history.

(56) References Cited

U.S. PATENT DOCUMENTS

| | | | |
|---|---|---|---|
| 3,708,618 A * | 1/1973 | Hofmeister et al. | 348/839 |
| 5,831,817 A * | 11/1998 | Chang | 361/679.07 |
| 6,317,926 B1 | 11/2001 | Ren | |
| 6,462,670 B1 | 10/2002 | Bolognia | |
| 6,556,438 B1 | 4/2003 | Bolognia | |
| 6,748,005 B1 | 6/2004 | Riazi | |
| 6,754,084 B1 | 6/2004 | Bolognia et al. | |
| 6,778,381 B1 | 8/2004 | Bolognia | |
| 6,783,105 B2 * | 8/2004 | Oddsen, Jr. | 248/279.1 |
| 7,157,648 B2 * | 1/2007 | Park | 174/481 |
| 2004/0228087 A1 | 11/2004 | Coglitore | |
| 2005/0173357 A1 | 8/2005 | McClain | |
| 2005/0195075 A1 | 9/2005 | McGraw | |
| 2006/0006298 A1 * | 1/2006 | Akiyama et al. | 248/292.12 |
| 2006/0203460 A1 | 9/2006 | Aviv | |
| 2007/0141895 A1 | 6/2007 | Karstens | |
| 2009/0034181 A1 * | 2/2009 | Gizycki | 361/683 |

FOREIGN PATENT DOCUMENTS

JP   3210528 A   9/1991

* cited by examiner

*Primary Examiner*—Michael C Zarroli

(57) ABSTRACT

Apparatus and methods for automatically positioning an interface module in a rack system are disclosed. An exemplary method includes biasing the interface module in a predetermined position. The method also includes automatically moving the interface module from the predetermined position when accessing removable blade enclosures in the rack system. The method also includes automatically returning the interface module to the predetermined position after accessing the removable blade enclosures in the rack system.

20 Claims, 11 Drawing Sheets

US 7,656,651 B2

APPARATUS AND METHODS FOR AUTOMATICALLY POSITIONING AN INTERFACE MODULE IN A RACK SYSTEM

PRIORITY APPLICATION

This application claims priority to co-owned U.S. Provisional Patent Application Ser. No. 60/943,201 filed Jun. 11, 2007 and hereby incorporated by reference as though fully set forth herein.

BACKGROUND

Rack systems are widely available in a variety of different sizes and configurations. In general, rack systems enable high-density computer systems in which processing units, storage units, and other peripheral devices are provided as modules (also referred to as "blade enclosures") that can be readily added, removed, replaced, or upgraded without having to replace the entire computer system.

Often, these rack systems are provided with separate interface modules (e.g., display and/or keypad devices), and due to space constraints the interface modules are typically connected to the rack system in front of the blade enclosures so as not to waste any space. These interface modules then have to be removed in order to allow access to the blade enclosures. The interface modules then need to be manually replaced into the desired position after accessing the blade enclosures The interface modules typically are centered between two blade enclosures to facilitate proper air flow around the interface device, and hence cooling of the blade enclosures. If the interface device is misaligned upon being replaced in the rack system, the interface device could obstruct airflow past the blade enclosure and result in overheating of the components housed in the blade enclosure.

DETAILED DESCRIPTION

Briefly, apparatus and methods for automatically positioning an interface module in a rack system are disclosed. In an exemplary embodiment, the interface module is held in a predetermined position (e.g., centered) with opposing springs along a guide sliding track. The interface module may be slid to a locked position (e.g., full left or full right) to provide access to removable blade enclosures mounted or loaded inside the rack system. For example, access may be desired to remove or replace a failed blade enclosure, add a new blade enclosure, or make a connection to a blade enclosure in the rack system. An integrated speed control device may also be provided to maintain controlled fluid motion, smooth operation, and to prevent damage. After accessing the blade enclosure, the interface module may be released from its locked position so that the interface module automatically slides back into the desired position. Accordingly, the apparatus consistently enables proper alignment for cooling air to flow substantially equally around the interface device and into and/or past the blade enclosure loaded in the rack system.

Figure 4A:
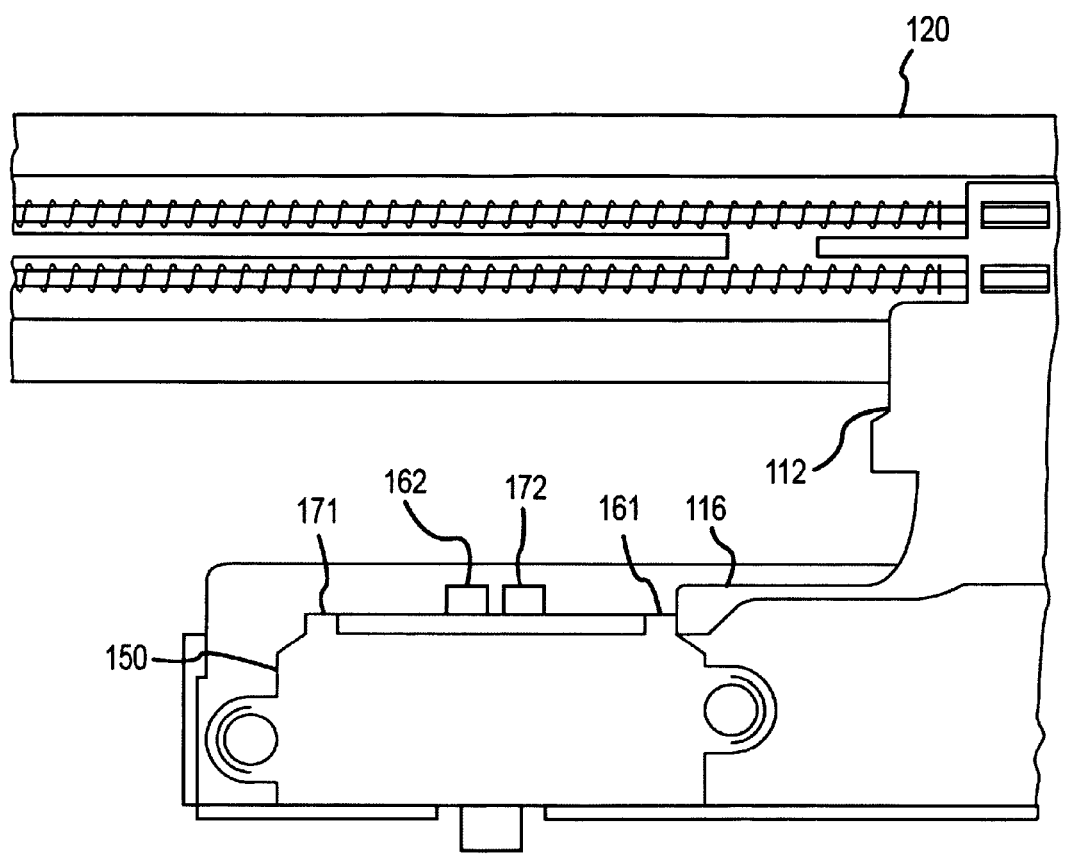
FIGS. 4a-c illustrate exemplary operation of a latch mechanism for the apparatus.

In an exemplary embodiment, an apparatus 100 for automatically positioning an interface module 110 in a rack system 10 comprises means for mounting an interface module 110 in front of removable blade enclosures 12a-b in the rack system 10. The apparatus 10 also comprises means 124 for biasing the interface module 110 in a predetermined position. The apparatus 100 also comprises means 124 for returning the interface module 110 to the predetermined position after moving. In another embodiment, the apparatus 100 may further comprise a means 161 for moving into a first position to automatically step the interface module 110 into a loaded position (FIG. 4a). In another embodiment, the apparatus 100 may further comprise means 162 for moving to a second position to release the interface module 110 from the loaded position (FIG. 4c), wherein the interface module 110 automatically slides into a centered position when released from the loaded position.

Figure 1A:
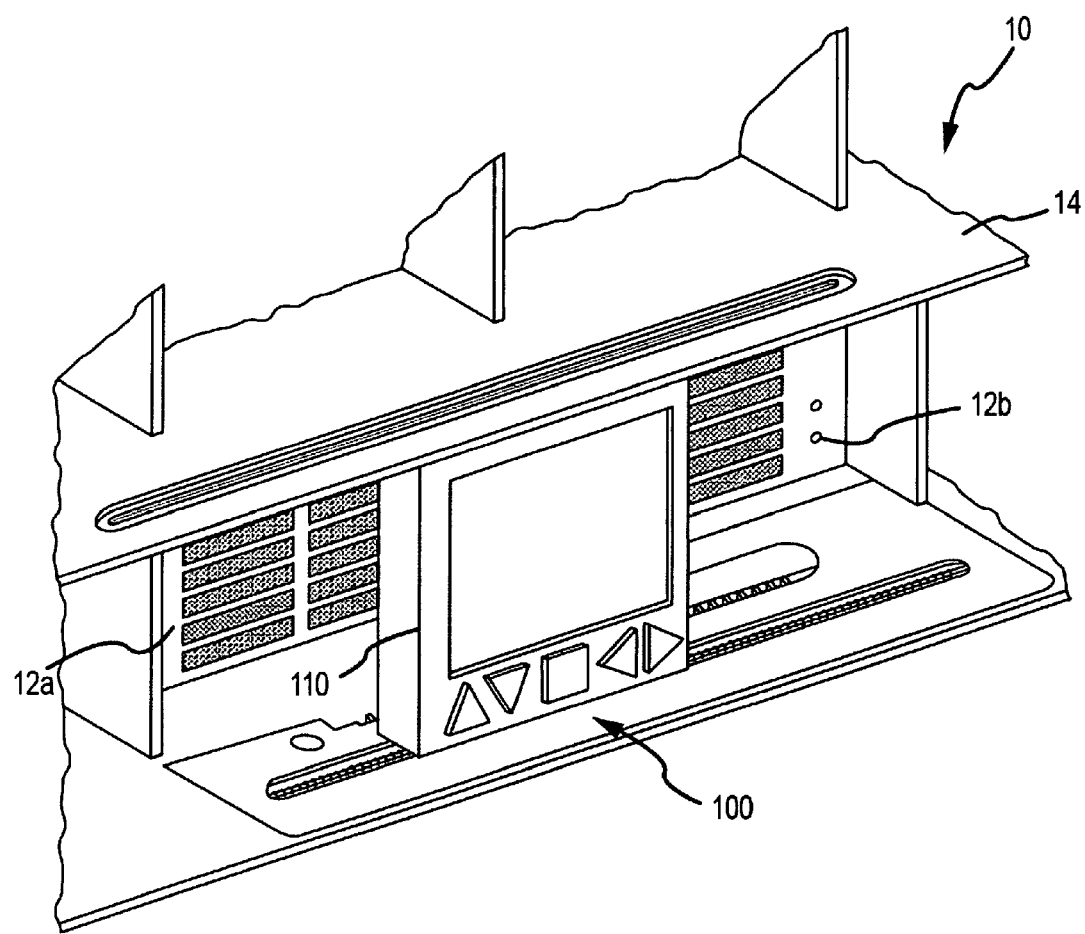
FIGS. 1a-b show perspective views of an exemplary rack system implementing an apparatus for automatically positioning an interface module in the rack system.
Figure 1B:
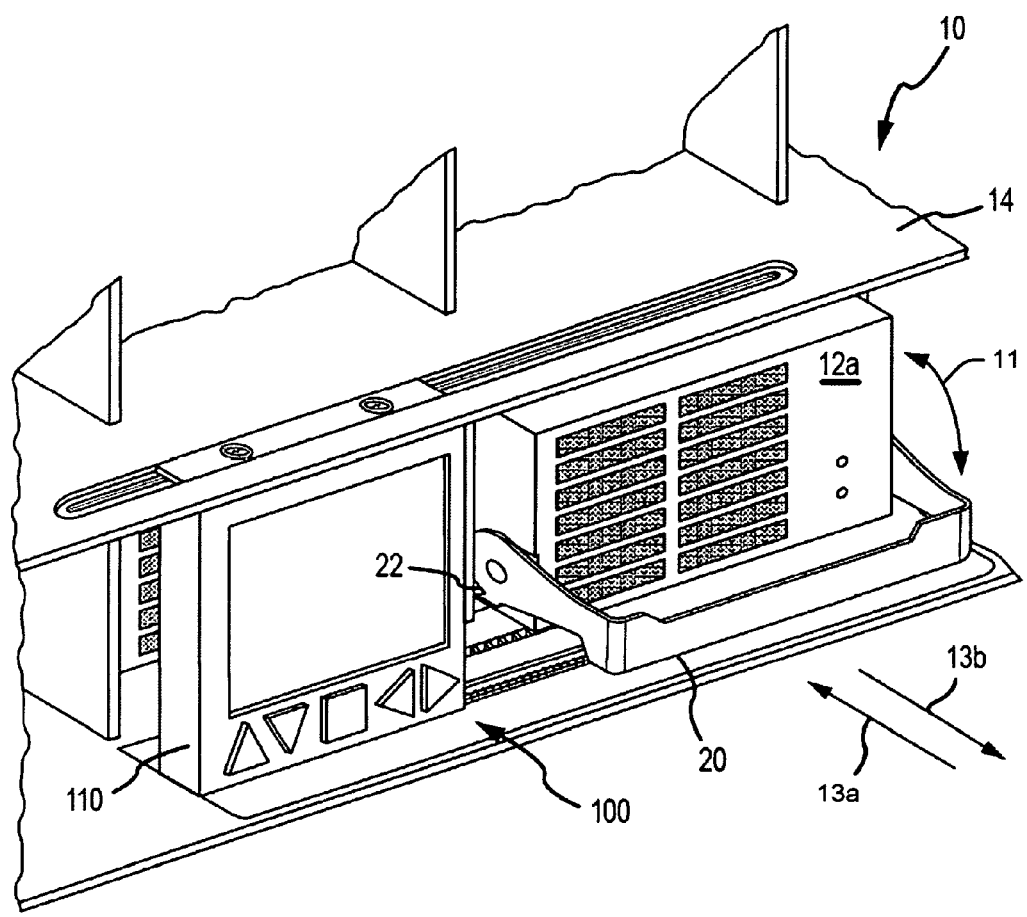

FIGS. 1a-b show perspective views of an exemplary rack system 10 implementing an apparatus 100 for automatically positioning an interface module 110 in the rack system 10. Exemplary rack system 10 may include a plurality of chassis or blade enclosures 12a-b mounted within a housing 14. The blade enclosures 12a-b may be any suitable size and may be manufactured of any suitable material, such as, e.g., a plastic or metal enclosure suitable for mounting in the housing 14 of the rack system 10.

Each blade enclosure 12a-b may house electronic and other electronic devices. For example, the blade enclosures 12a-b may house a PC board including one or more processing units or processors and other devices and components mounted to, connected to, or positioned near the PC board. For example, rack mount servers may include data storage devices (e.g., hard disk drives, compact disc (CD) or digital versatile disc (DVD) drives, etc.) and operate in a communications network, and therefore include suitable network connection interface(s). Still other devices and components may also be mounted on or otherwise connected to the PC board, as is readily apparent to one having ordinary skill in the computer and electronic arts.

Consistent with the desire for a small footprint and high density for the rack system 10, the interface module 110 may be positioned in front of the blade enclosures 12a-b, and moved on an as-needed basis to provide access to the blade enclosures 12a-b. In FIG. 1a, blade enclosures 12a-b are shown as they may be loaded in the rack system 10 behind the interface module 110. In FIG. 1b, the interface module 110 is shown moved to one side so that the handle 20 of one of the blade enclosures (in this example, blade enclosure 12a) may be rotated in the direction of arrows 11 to lock and release the blade enclosure 12a, and then position the blade enclosure 12a in the rack system 10 (e.g., inserted in the direction of arrow 13a, or removed in the direction of arrow 13b).

During operation, one or more components (e.g., the processors) in the blade enclosures 12a-b may generate heat. Accordingly, the front of the blade enclosures 12a-b may include openings to allow air flow. Although not required, vents may also be provided on the sides of the blade enclosures 12a-b to further facilitate the air flow. Fans or other heat removal devices may also be provided in the rack system 10 and/or individual blade enclosures 12a-b to generate air flow for removing heat.

Apparatus 100 helps ensure consistent positioning of the interface module 110 at a desired position in front of the blade enclosures. In an exemplary embodiment, the interface module may automatically slide back into a substantially centered position between two blade enclosures 12a-b. Accordingly, the apparatus consistently enables proper alignment of the interface device for cooling air to flow substantially equally around the interface device and into and/or past the blade enclosures 12a-b loaded in the rack system 10.

Before continuing, it is noted that the apparatus 100 is not limited to use with any particular type, number, or configuration of rack system, blade enclosure, computer, or other electronic device. Modifications of apparatus 100 may be made to size, contour, and/or configuration so that the apparatus 100 can be used with any of a wide variety of systems now known or later developed. Such modifications may depend at least to some extent on design considerations, as will be readily apparent to those having ordinary skill in the art after becoming familiar with the teachings herein.

FIGS. 2a-d show more detailed perspective views of the apparatus 100 for automatically positioning an interface module 110 in a rack system (e.g., rack system 10 shown in FIGS. 1a-b). Exemplary apparatus 100 may include a platform 120 for mounting in front of removable blade enclosures (e.g., blade enclosures 12a-b in rack system 10 in FIGS. 1a-b). The interface module 110 is slidably mounted to the platform 120 as illustrated in FIGS. 2a-d.

Figure 2A:
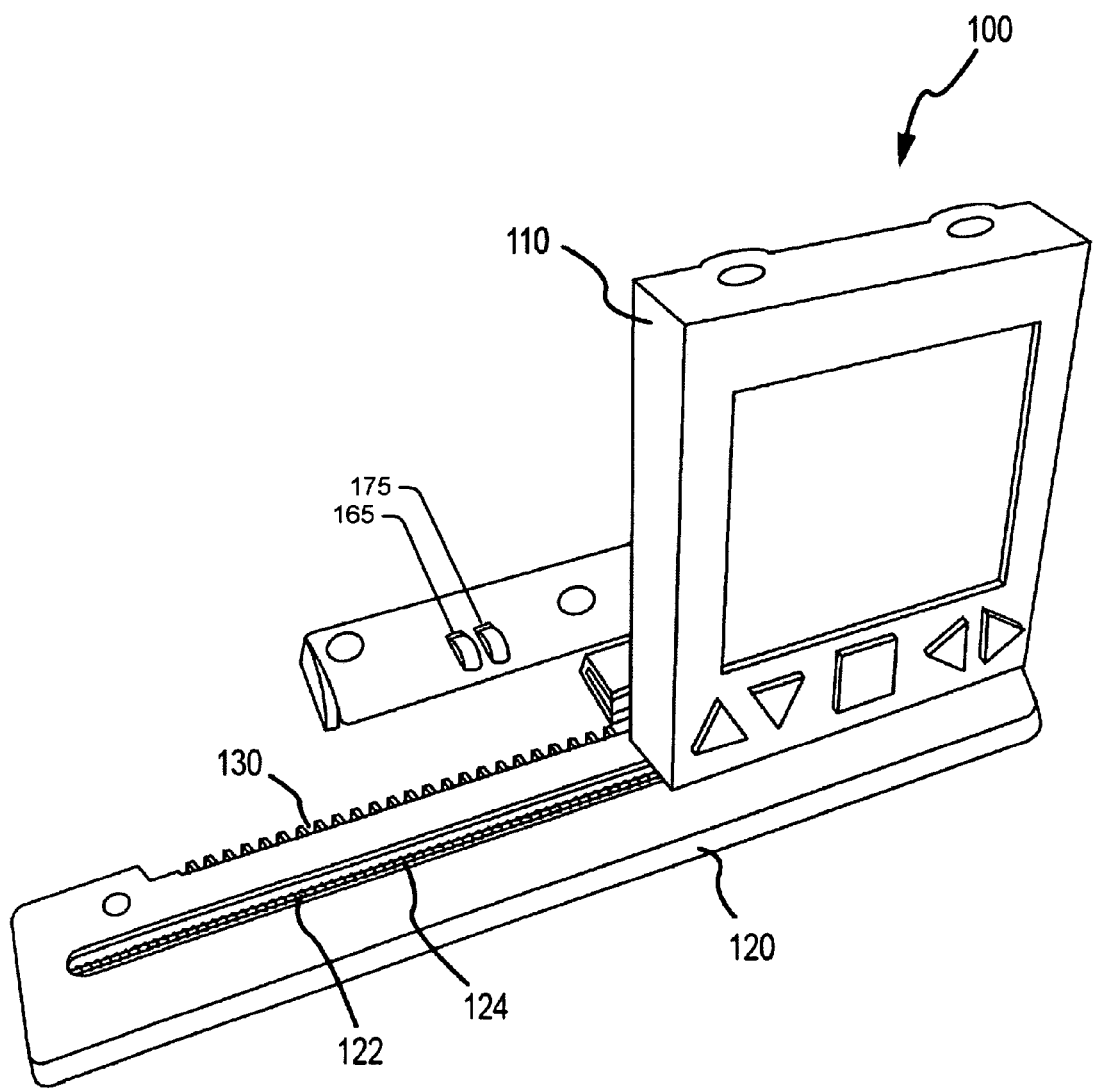
FIGS. 2a-d show more detailed perspective views of the apparatus for automatically positioning an interface module in the rack system shown in FIGS. 1a-b.
Figure 2B:
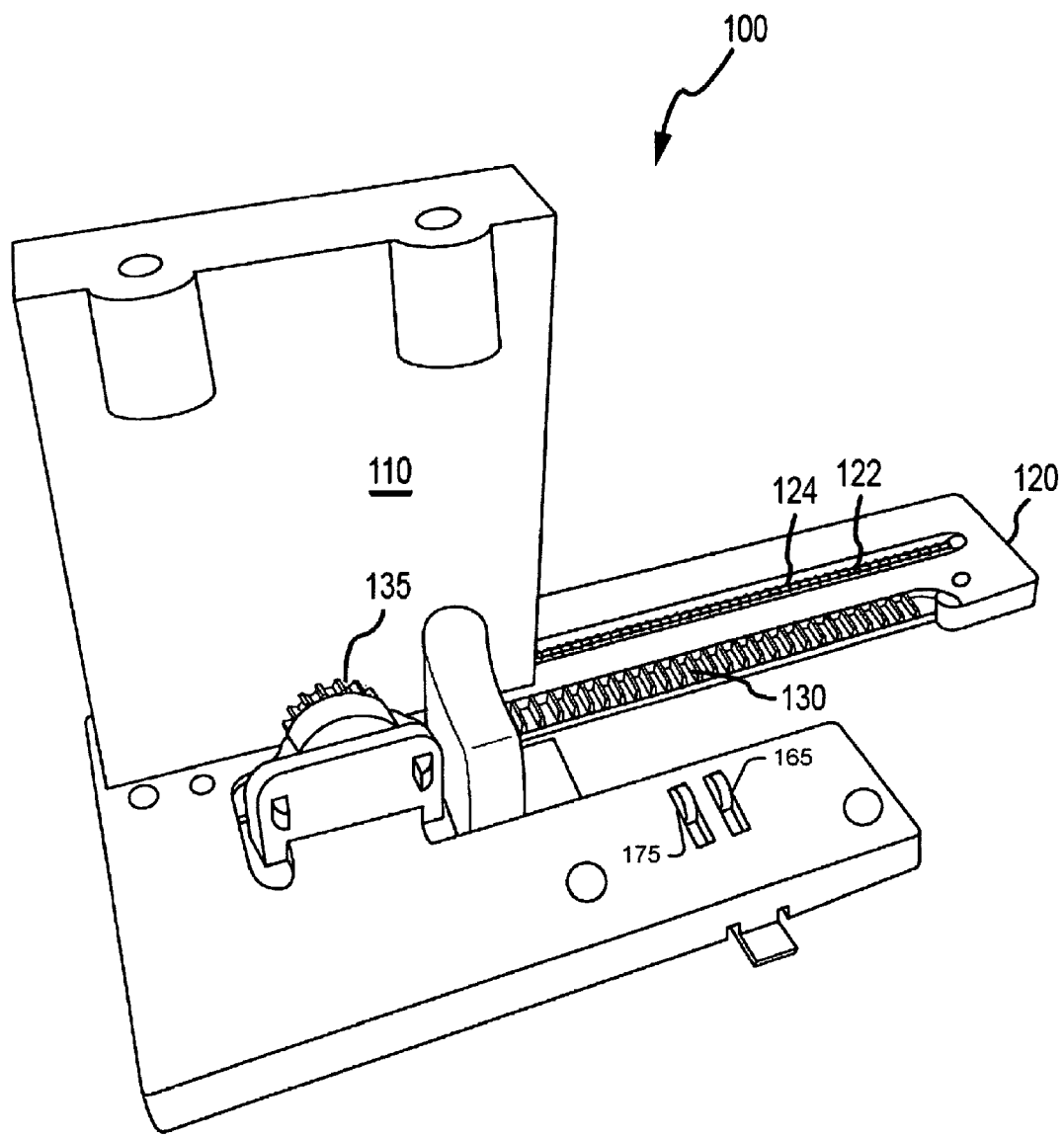
Figure 2C:
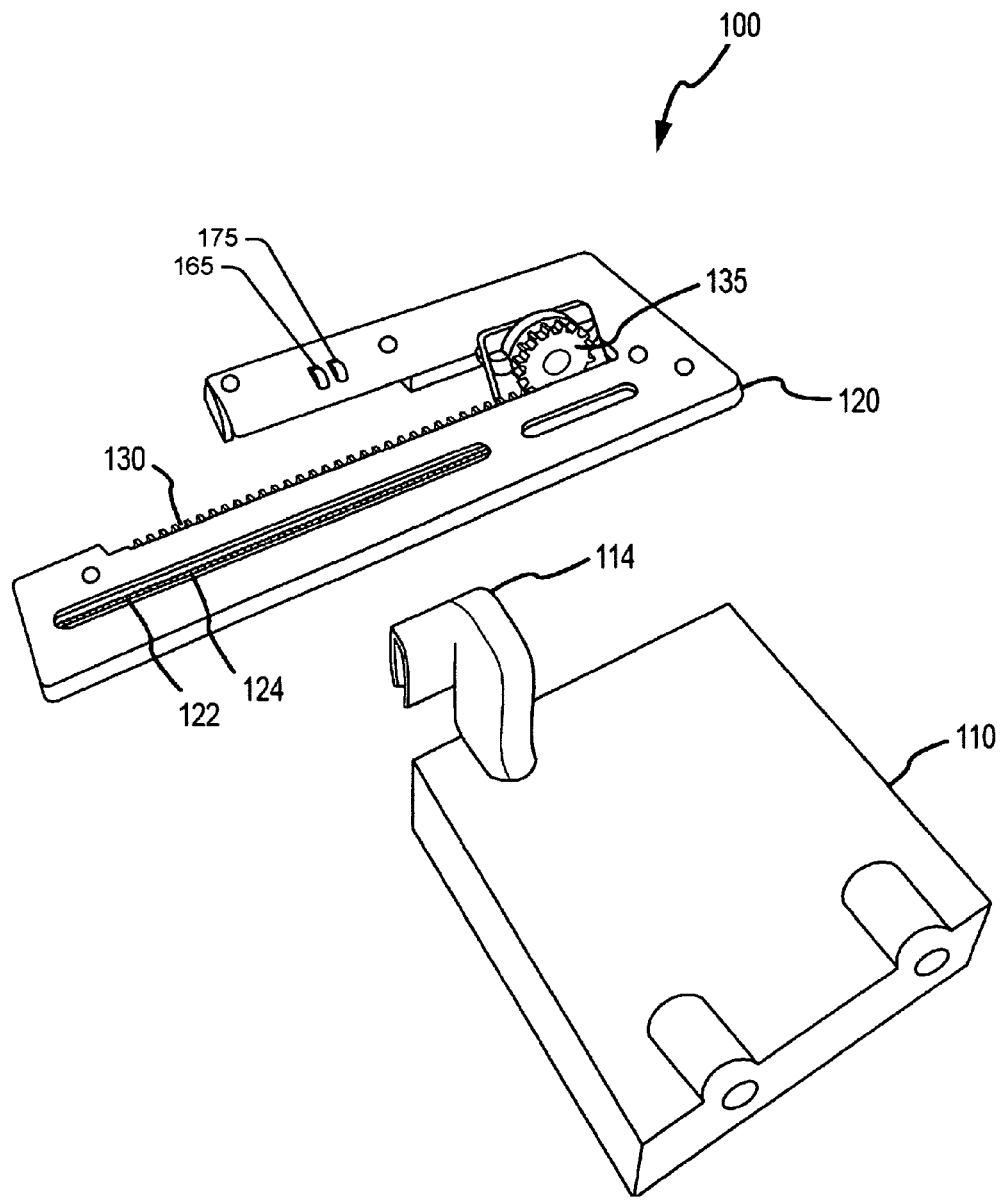
Figure 2D:
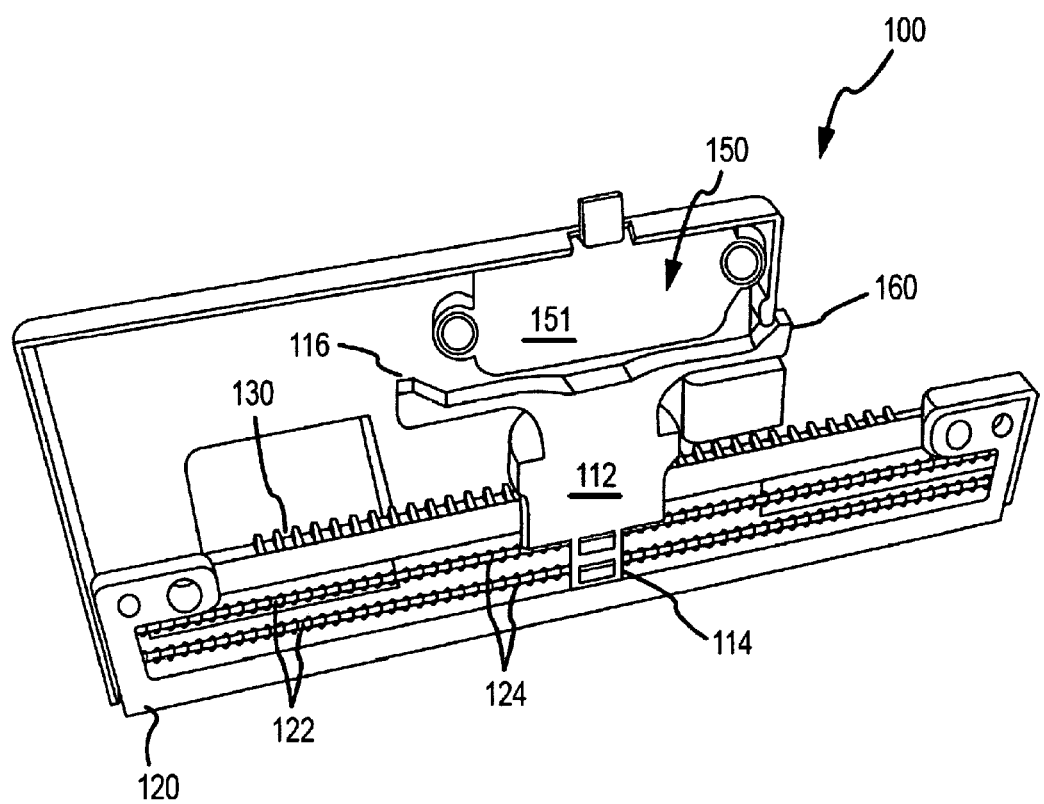

In an exemplary embodiment, at least one guide rail 122 may be provided on the platform 120 and the interface module is slidably mounted to the at least one guide rail 122. It is noted that two guide rails 122 are shown in FIG. 2d. Although a plurality of guide rails serve to reduce torsion and binding, any suitable number of guide rails may be implemented.

Also in an exemplary embodiment, a plurality of springs 124 are mounted to the platform (e.g., provided on the at least one guide rail). The springs 124 are operatively associated with the interface module 110 to bias the interface module 110 in a predetermined position. In the example shown in FIG. 2d, the interface module 110 is connected to carriage 112, which in turn is slidably mounted to guide rails 122 by connector 114.

In operation, the force of the springs 124 against the connector 114 serves to automatically return the carriage 112, and hence the interface module 110 to a predetermined position (e.g., centered or substantially centered) after it has been moved against the force of the springs 124.

Still other features may be implemented for apparatus 100. For example, the apparatus 100 may comprise at least one indexing track 130 mounted on the platform 120. The at least one indexing track 130 is operatively associated with a gear wheel 135 on the carriage 112 to provide controlled fluid and smooth movement of the interface module 110 and reduce or altogether eliminate shock or other damage to the interface module 110 during operation. In an exemplary embodiment, the track and gear wheel 135 are lubricated to further provide controlled motion of the carriage 112, in particular, when moving under the force of the springs 124.

Also for example, the apparatus 100 may comprise a latch mechanism 150 for holding the interface module 110 in a fixed position. The latch mechanism 150 serves to retain the carriage 112 in a fixed position after being moved to one side or the other against the force of the plurality of springs to enable access for the removable blade enclosures in the rack system (see, e.g., FIG. 1b). The latch mechanism 150 may also be operated to release the carriage 112 and hence return the interface module 110 to a predetermined position. In an exemplary embodiment, the carriage 112 is released automatically after the blade enclosure has been inserted or removed. An exemplary latch mechanism 150 is shown in more detail in FIGS. 3a-b.

Figure 3A:
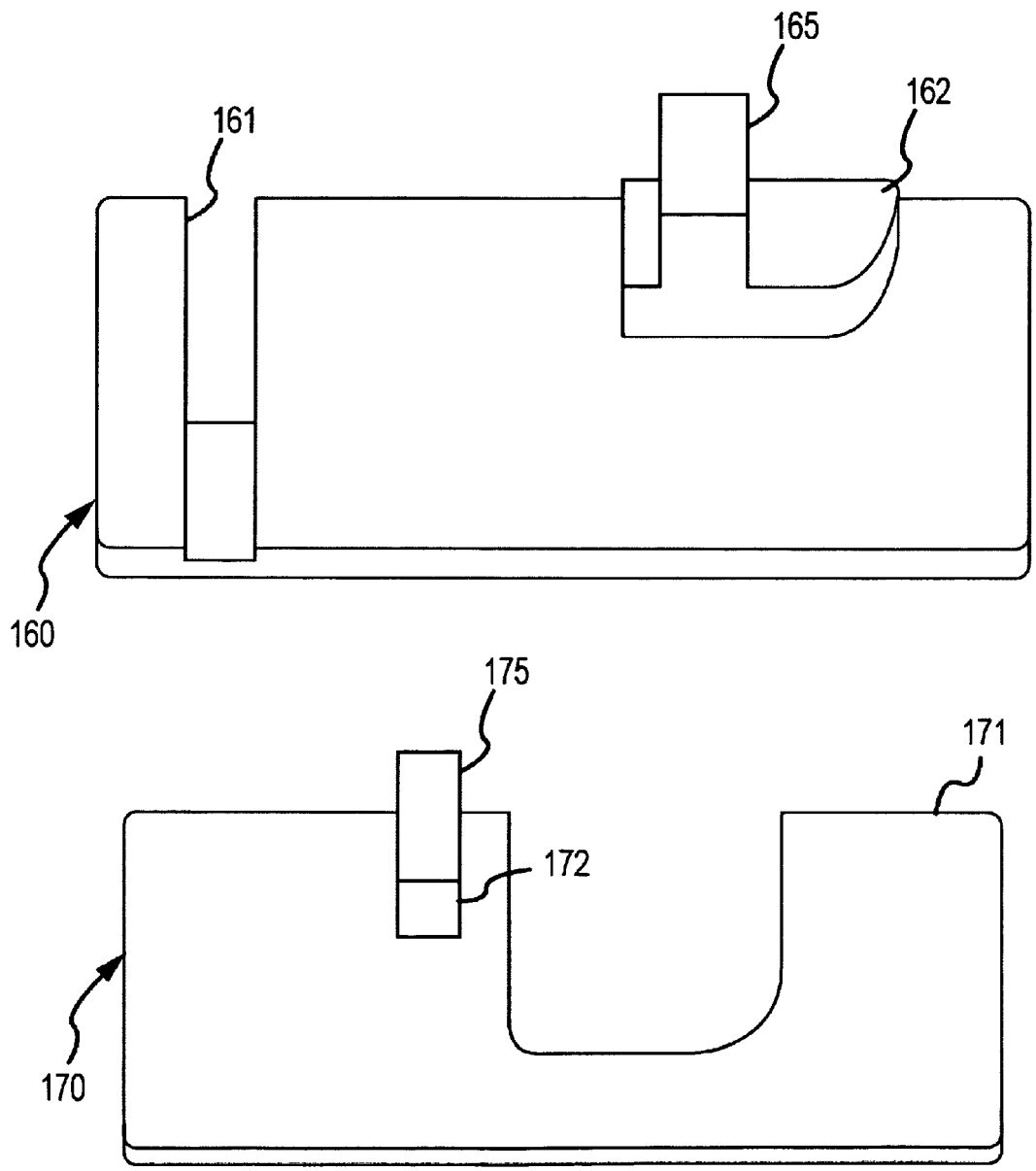
FIGS. 3a-b show a latch mechanism for the apparatus in more detail.
Figure 3B:
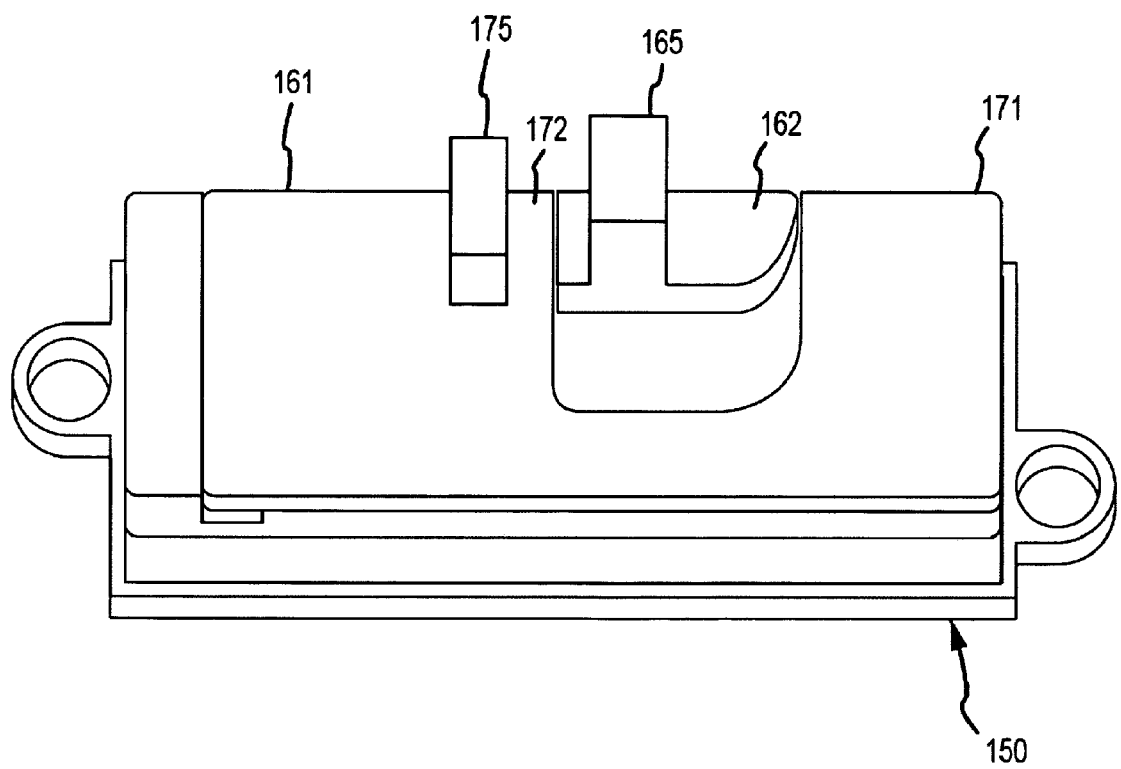

FIGS. 3a-b show a latch mechanism 150 in more detail. Latch mechanism 150 may be mounted to the platform 120 for the apparatus 100. FIG. 3a shows actuators 160, 170 separately to illustrate detail. FIG. 3b shows the latch mechanisms 150 with a cover plate 151 (FIG. 2d) removed so that the actuators 160, 170 may be seen movably mounted therein.

Figure 4B:
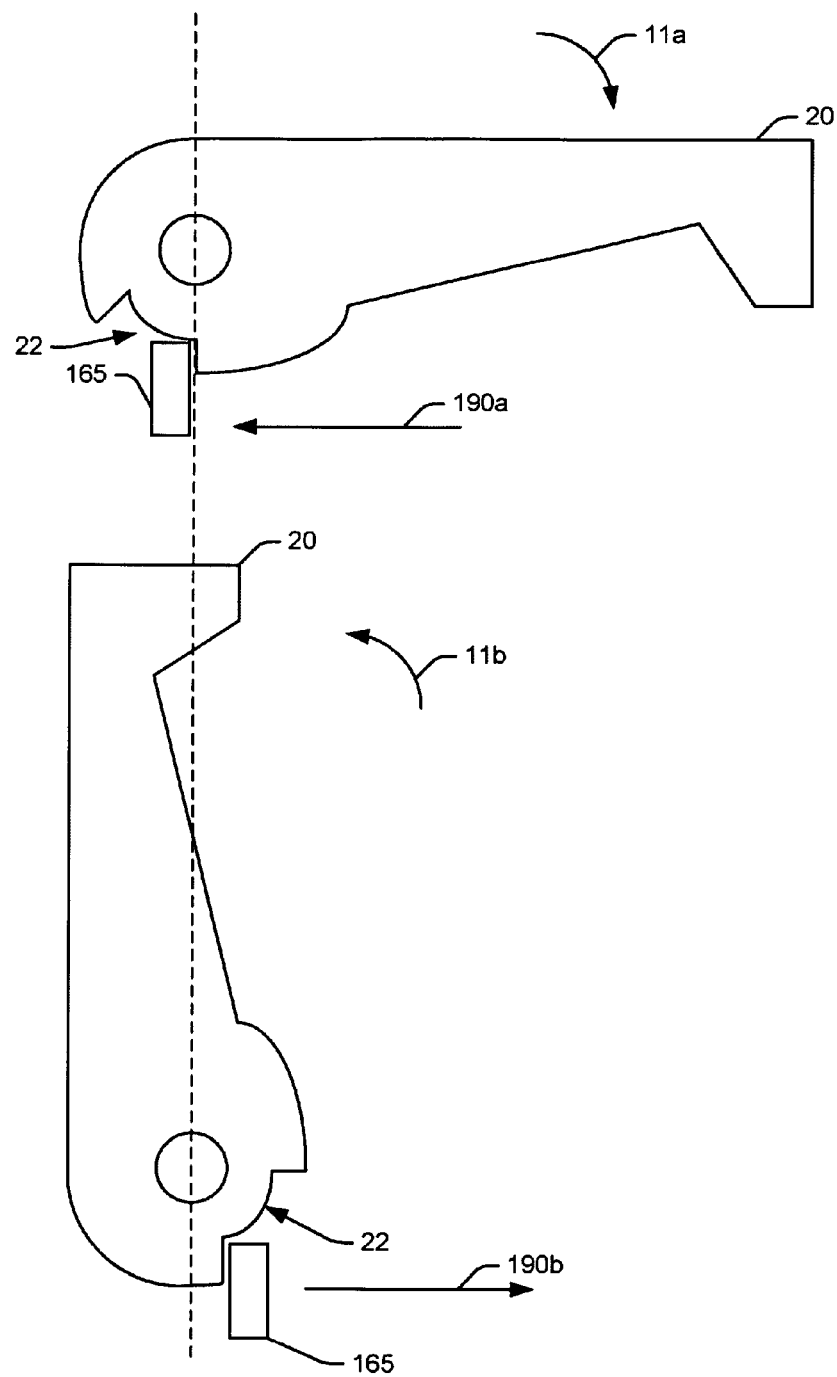

The latch mechanism 150 may include a right actuator 160 and a left actuator 170. The right actuator includes a first trigger 161 and a second trigger 162. The second trigger 162 includes a post 165. The left actuator 170 includes a first trigger 171 and a second trigger 172. The second trigger 172 includes a post 175. Posts 165 and 175 protrude through the platform 120 (e.g., as shown in FIG. 2b) and may be engaged and operated by ejection cam lever portion 22 of handle 20 (e.g., shown in FIG. 1b). Operation of the latch mechanism 150 can be better understood with reference to FIGS. 4a-c.

In FIG. 4a, the interface module 110 is shown as it may be slid to one side or the other, e.g., manually by the user's fingers pushing on the interface module 110 so that the interface module 110 moves one side (e.g., as shown in FIG. 1b). When the interface module 110 is slid fully to one side or the other (e.g., either full left or full right), the blade enclosure 12a opposite of the interface module's position can be removed with the ejection cam lever 22 of handle 20 (see FIG. 1b). Operation of the handle 20 and ejection cam lever 22 is illustrated FIG. 4b. Rotating the handle 20 in the direction of arrow 11a to release the blade enclosure 12a from the rack system causes the ejection cam lever 22 to engage and slide the post 165 in the direction illustrated by arrow 190 to effectuate operation of the latch mechanism 150. The first trigger 152 moves into a first position, engaging the arm 116 of carriage 112 to automatically hold the interface module 110 in a locked or loaded position as can be seen in FIG. 4a.

Figure 4C:
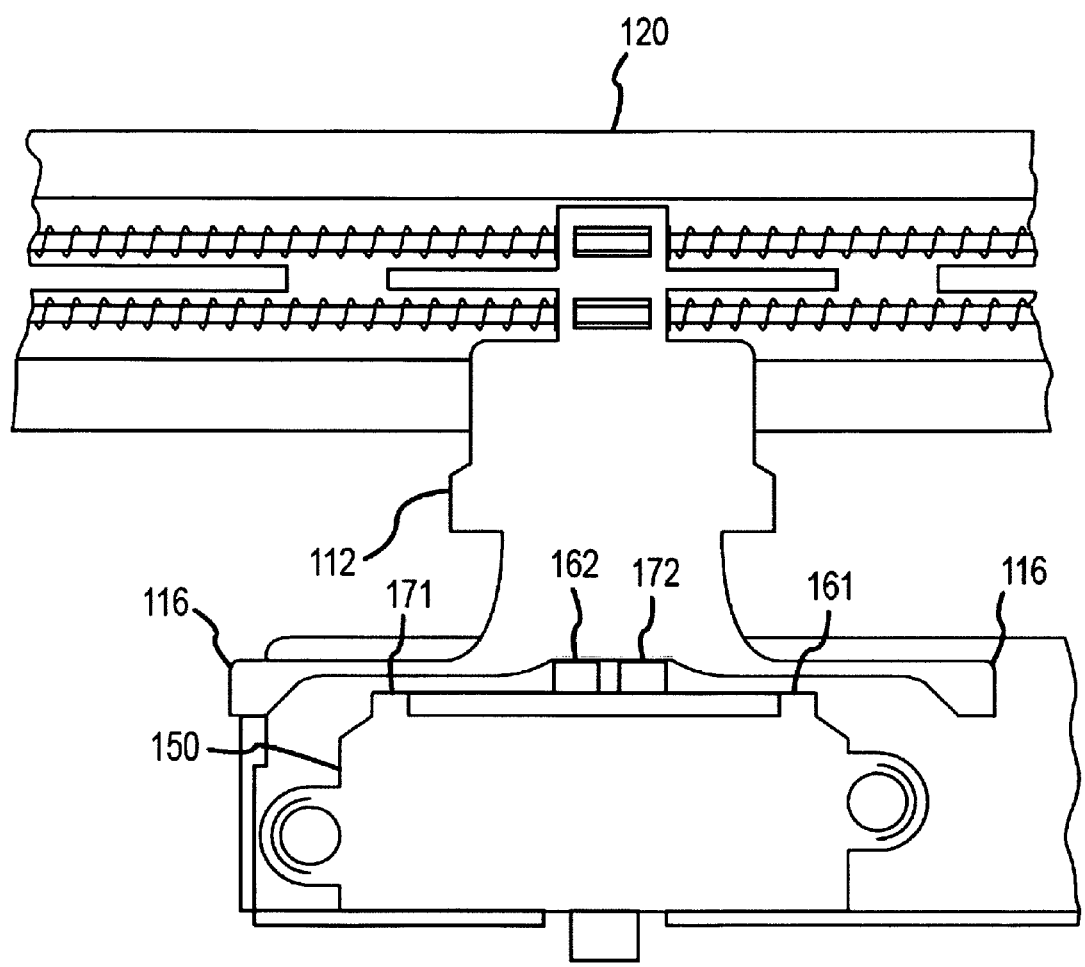

When the blade enclosure 12a is inserted into the respective enclosure opening in the rack system, rotating handle 20 in the direction of arrow 11b (FIG. 4b) causes the ejection cam lever 22 to engage and slide post 165 in the opposite direction as illustrated by arrow 190b. The second trigger 154 then moves to a second position, releasing the arm 116 of carriage 112, and allowing the interface module 110 to move from the locked position, as illustrated in FIG. 4c. Accordingly, the interface module 110 automatically slides into a predetermined or centered position.

Although operation has been described when the interface module 110 is moved all the way to one side (e.g., the left side when facing the rack system 10 to access blade enclosure 12a), the operations are mirrored when the interface module 110 is moved all the way to the other side (e.g., the right side to remove blade enclosure 12b). Therefore, a description of the operations is not repeated again here for sake of brevity.

It is noted that the exemplary embodiments discussed above are provided for purposes of illustration. Still other embodiments are also contemplated. It is also noted that, although the systems and methods are described with reference to rack systems, in other exemplary embodiments, the apparatus may be implemented for other electronic devices, such as, a collection of peripheral devices for computers, video and audio equipment, etc.

In addition to the specific embodiments explicitly set forth herein, other aspects and embodiments will be apparent to those skilled in the art from consideration of the specification disclosed herein. It is intended that the specification and illustrated embodiments be considered as examples only.

The invention claimed is:

1. An apparatus for automatically positioning an interface module in a rack system, comprising:

a platform for mounting in front of removable blade enclosures in the rack system;

an interface module slidably mounted to the platform; and a plurality of springs mounted to the platform and operatively associated with the interface module to bias the interface module in a predetermined position so that the interface module is movable from the predetermined position and the interface module returns under force of the plurality of springs to the predetermined position after being moved.

2. The apparatus of claim 1, further comprising at least one guide rail on the platform, the interface module slidable mounted to the at least one guide rail.

3. The apparatus of claim 2, wherein the plurality of springs are provided on the at least one guide rail.

4. The apparatus of claim 1, further comprising at least one indexing track mounted on the platform, the at least one indexing track providing controlled fluid and smooth movement of the interface module.

5. The apparatus of claim 1, further comprising a latch mechanism for holding the interface module in a fixed position against the force of the plurality of springs for accessing removable blade enclosures behind the interface module in the rack system.

6. The apparatus of claim 1, further comprising a first trigger on the platform, the first trigger moving into a first position to automatically step the interface module into a loaded position.

7. The apparatus of claim 6, further comprising a second trigger on the platform, the second trigger moving to a second position to release the interface module from the loaded position.

8. The apparatus of claim 7, wherein the interface module automatically slides into a centered position when released from the loaded position.

9. A method for automatically positioning an interface module in a rack system, comprising:

biasing the interface module in a predetermined position;

automatically moving the interface module from the predetermined position when accessing removable blade enclosures in the rack system; and automatically returning the interface module to the predetermined position after accessing the removable blade enclosures in the rack system.

10. The method of claim 9, further comprising sliding the interface module along at least one guide rail.

11. The method of claim 9, wherein biasing is provided by a plurality of springs.

12. The method of claim 9, further comprising providing controlled fluid and smooth movement of the interface module along at least one indexing track.

13. The method of claim 9, further comprising latching the interface module in a fixed position for accessing the removable blade enclosures behind the interface module in the rack system.

14. The method of claim 9, further comprising automatically stepping the interface module into a loaded position.

15. The method of claim 14, further comprising moving a first trigger into a first position to automatically step the interface module into a loaded position.

16. The method of claim 15, further comprising moving a second trigger to a second position to release the interface module from the loaded position.

17. The method of claim 16, wherein the interface module automatically slides into a centered position when released from the loaded position.

18. An apparatus for automatically positioning an interface module in a rack system, comprising:

means for mounting an interface module in front of removable blade enclosures in the rack system;

means for biasing the interface module in a predetermined position; and means for returning the interface module to the predetermined position after moving.

19. The apparatus of claim 18, further comprising a means for moving into a first position to automatically step the interface module into a loaded position.

20. The apparatus of claim 19, further comprising means for moving to a second position to release the interface module from the loaded position, wherein the interface module automatically slides into a centered position when released from the loaded position.

* * * * *